US008396509B2

(12) United States Patent
Chen et al.

(10) Patent No.: US 8,396,509 B2
(45) Date of Patent: Mar. 12, 2013

(54) SIGNAL TRANSMISSION PATH SELECTION CIRCUIT AND METHOD, AND ELECTRONIC DEVICE EMPLOYING THE CIRCUIT

(75) Inventors: Shih-An Chen, Taipei Hsien (TW); Hsun-Wu Lee, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 813 days.

(21) Appl. No.: 12/582,519

(22) Filed: Oct. 20, 2009

(65) Prior Publication Data
US 2010/0109749 A1    May 6, 2010

(30) Foreign Application Priority Data

Nov. 4, 2008 (TW) ................................ 97142497 A

(51) Int. Cl.
*H04B 1/38* (2006.01)
(52) U.S. Cl. .......... 455/557; 710/305; 710/316; 381/81
(58) Field of Classification Search ............... 381/77, 381/80, 81, 85, 74, 2, 59; 700/94; 710/2, 710/38, 62, 100, 305, 313, 316, 36; 439/131, 439/638, 660, 577, 669; 200/176; 455/557
See application file for complete search history.

(56) References Cited

U.S. PATENT DOCUMENTS

| 6,765,791 B2 | 7/2004 | Syring et al. |
| 7,899,946 B2 * | 3/2011 | Sherman et al. ................. 710/8 |
| 8,180,395 B2 * | 5/2012 | Moran et al. ............... 455/556.1 |
| 2006/0053239 A1 | 3/2006 | Zheng et al. |
| 2007/0180170 A1 * | 8/2007 | Choi et al. ....................... 710/74 |
| 2008/0109587 A1 * | 5/2008 | Greenhalgh et al. .......... 710/316 |
| 2009/0075624 A1 * | 3/2009 | Cox et al. ....................... 455/345 |
| 2009/0164675 A1 * | 6/2009 | Chen et al. ...................... 710/64 |

FOREIGN PATENT DOCUMENTS

CN    101030189 A    9/2007

OTHER PUBLICATIONS

First office action issued by Chinese Patent Office for corresponding Chinese application 200810180040.3 dated Feb. 24, 2011 and includes abridged English translation of office action.

* cited by examiner

*Primary Examiner* — Vivian Chin
*Assistant Examiner* — Friedrich W Fahnert
(74) *Attorney, Agent, or Firm* — Frommer Lawrence & Haug LLP; Ronald R. Santucci

(57) ABSTRACT

An electronic device includes a central processing unit, a USB connector, a USB switch, and an audio path selector. The USB switch has a data transmission path and an audio signal transmission path for signal transmission between the central processing unit and the USB connector. The USB switch selects the data transmission path for data transmission according to a first selection signal from the central processing unit, and selects the audio signal transmission path for audio signal transmission according to a second selection signal from the central processing unit. The audio path selector interconnects the central processing unit and the USB switch, and has a first audio path for output of audio signals from the central processing unit to the audio signal transmission path, and a second audio path for output of audio signals from the audio signal transmission path to the central processing unit.

20 Claims, 6 Drawing Sheets

SIGNAL TRANSMISSION PATH SELECTION CIRCUIT AND METHOD, AND ELECTRONIC DEVICE EMPLOYING THE CIRCUIT

CROSS-REFERENCE TO RELATED APPLICATION

This application claims priority of Taiwanese Application No. 097142497, filed on Nov. 4, 2008, the disclosure of which is incorporated herein by reference.

BACKGROUND OF THE INVENTION

1. Field of the Invention

The invention relates to a signal transmission circuit and method, more particularly to a signal transmission path selection circuit and method for an electronic device.

2. Description of the Related Art

In the design of a conventional mobile phone 2, if the mobile phone 2 is to have both a USB mode for transmitting data, such as audio-visual data, images, text, etc., and an audio mode for transmitting audio signals, such as music, voice, etc., a USB connector 20 having ten pins, such as that schematically shown in FIG. 1, is generally required. The USB connector 20 is connected to a central processing unit 21 of the mobile phone 2, and can be connected to a matching USB connector 30 provided on a computer device 3 such as that shown in FIG. 2, or to a matching USB connector 40 of an external earphone/microphone device 4 such as that shown in FIG. 3. The first five pins of the USB connector 20 are provided for data transmission between the mobile phone 2 and the computer device 3 in the USB mode, whereas the last five pins of the USB connector 20 are provided for audio signal transmission between the mobile phone 2 and the external earphone/microphone device 4 in the audio mode.

However, the USB connector 20 with ten pins has a larger size than a mini USB connector with five pins (not shown), and takes up more space in the mobile phone 2, so that there is less available space in the mobile phone 2. Therefore, if the functions of the USB connector 20 with ten pins can be replaced by the mini USB connector with five pins, the space occupied by the USB connector 20 when disposed in the mobile phone 2 and when connected to a matching device can be reduced.

SUMMARY OF THE INVENTION

The primary object of the present invention is to provide an electronic device capable of selectively operating in one of a USB mode and an audio mode using a mini USB connector with five pins.

Accordingly, the electronic device of this invention comprises a central processing unit, a USB connector, a USB switch interconnecting the central processing unit and the USB connector, and an audio path selector.

The USB switch has a data transmission path and an audio signal transmission path for signal transmission between the central processing unit and the USB connector. The USB switch selects the data transmission path for data transmission according to a first selection signal from the central processing unit, and selects the audio signal transmission path for audio signal transmission according to a second selection signal from the central processing unit.

The audio path selector is electrically connected to the central processing unit and the USB switch, and has a first audio path for output of audio signals from the central processing unit to the audio signal transmission path of the USB switch, and a second audio path for output of audio signals from the audio signal transmission path of the USB switch to the central processing unit.

The USB connector includes a data/right speaker pin and a data/left speaker/microphone pin, which are electrically connected to the USB switch for transmission of data and audio signals.

The USB switch includes : a pair of data pins connected to the central processing unit; a pair of audio pins, one of the audio pins being connected to the central processing unit via the audio path selector; and a pair of output/input pins connected to a pair of data/audio pins of the USB connector. The data pins are connected to the output/input pins so as to form the data transmission path. The audio pins are connected to the output/input pins so as to form the audio signal transmission path.

Preferably, the central processing unit generates the first selection signal upon detecting that the data pins have received data.

The USB connector includes a detect pin. The detect pin has a voltage which is lower than a first level when the USB connector is connected to an external earphone/microphone device. The central processing unit generates the second selection signal upon detecting that the voltage of the detect pin is lower than the first level.

Preferably, the audio path selector includes an audio input terminal and an audio output terminal, which are connected to the central processing unit, and an audio output/input terminal connected to said one of the audio pins of the USB switch. The audio input terminal is connected to the audio output/input terminal to form the first audio path. The audio output terminal is connected to the audio output/input terminal to form the second audio path.

Preferably, the electronic device further comprises a transistor switch electrically connected to the detect pin of the USB connector and the central processing unit. The central processing unit controls the transistor switch to cause the voltage of the detect pin to be maintained at a second level and to thereby control the audio path selector to select the first audio path for audio signal transmission. The central processing unit further controls the transistor switch to cause the voltage of the detect pin to be maintained at a third level and to thereby control the audio path selector to select the second audio path for audio signal transmission.

Preferably, the electronic device is a mobile phone, and is configured such that the voltage of the detect pin is maintained at the second level when the USB connector is connected to an external earphone/microphone device, and such that the voltage of the detect pin is maintained at the third level when there is an incoming call on the electronic device.

Preferably, the USB connector is a 5-pin mini USB connector, and the transistor switch is an NMOS transistor.

The invention utilizes the central processing unit to control the USB switch to select the data transmission path for transmission of data or to select the audio signal transmission path for transmission of audio signals, and to further control the audio path selector to transmit audio signals from the central processing unit via the first audio path and to transmit audio signals from the USB connector via the second audio path, thereby achieving the effect of enabling the electronic device to selectively operate in one of a USB mode and an audio mode using a mini USB connector with only five pins.

The invention further provides a signal transmission path selection method for use between a central processing unit and a USB connector of an electronic device. The method comprises: (A) providing a data transmission path and an audio signal transmission path for signal transmission between the central processing unit and the USB connector; (B) selecting the data transmission path for transmission of data according to a first selection signal from the central processing unit, and selecting the audio signal transmission path for transmission of audio signals according to a second selection signal from the central processing unit; and (C) providing a first audio path and a second audio path between the audio signal transmission path and the central processing unit, the first audio path being for output of audio signals from the central processing unit to the audio signal transmission path, the second audio path being for output of audio signals from the audio signal transmission path to the central processing unit.

Preferably, the USB connector includes a data/right speaker pin and a data/left speaker/microphone pin, which are electrically connected to the USB switch for transmission of data and audio signals. The central processing unit includes a pair of data pins connected respectively to the data/right speaker pin and the data/left speaker/microphone pin of the USB connector via the data transmission path. The central processing unit detects voltage level changes in the data pins when the USB connector is connected to a computer device, and generates the first selection signal in response thereto.

Preferably, the USB connector includes a detect pin. The detect pin has a voltage lower than a first level when the USB connector is connected to an external earphone/microphone device. The central processing unit generates the second selection signal upon detecting that the voltage of the detect pin is lower than the first level.

In the aforesaid method of this invention, with the use of the first selection signal to select the data transmission path for transmission of data or the use of the second selection signal to select the audio signal transmission path for transmission of audio signals, and through the use of the first audio path to transmit audio signals from the central processing unit and the use of the second audio path to transmit audio signals from the USB connector, the electronic device employing the method is capable of selectively operating in one of a USB mode and an audio mode using a mini USB connector with only five pins.

In addition, this invention further provides a signal transmission path selection method, which comprises:

(A) providing a data transmission path and an audio signal transmission path for signal transmission, selecting the data transmission path for transmission of data according to a first selection signal, and selecting the audio signal transmission path for transmission of audio signals according to a second selection signal; and (B) providing a first audio path and a second audio path, the first audio path being for output of received audio signals to the audio signal transmission path, the second audio path being for output of the audio signals from the audio signal transmission path.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
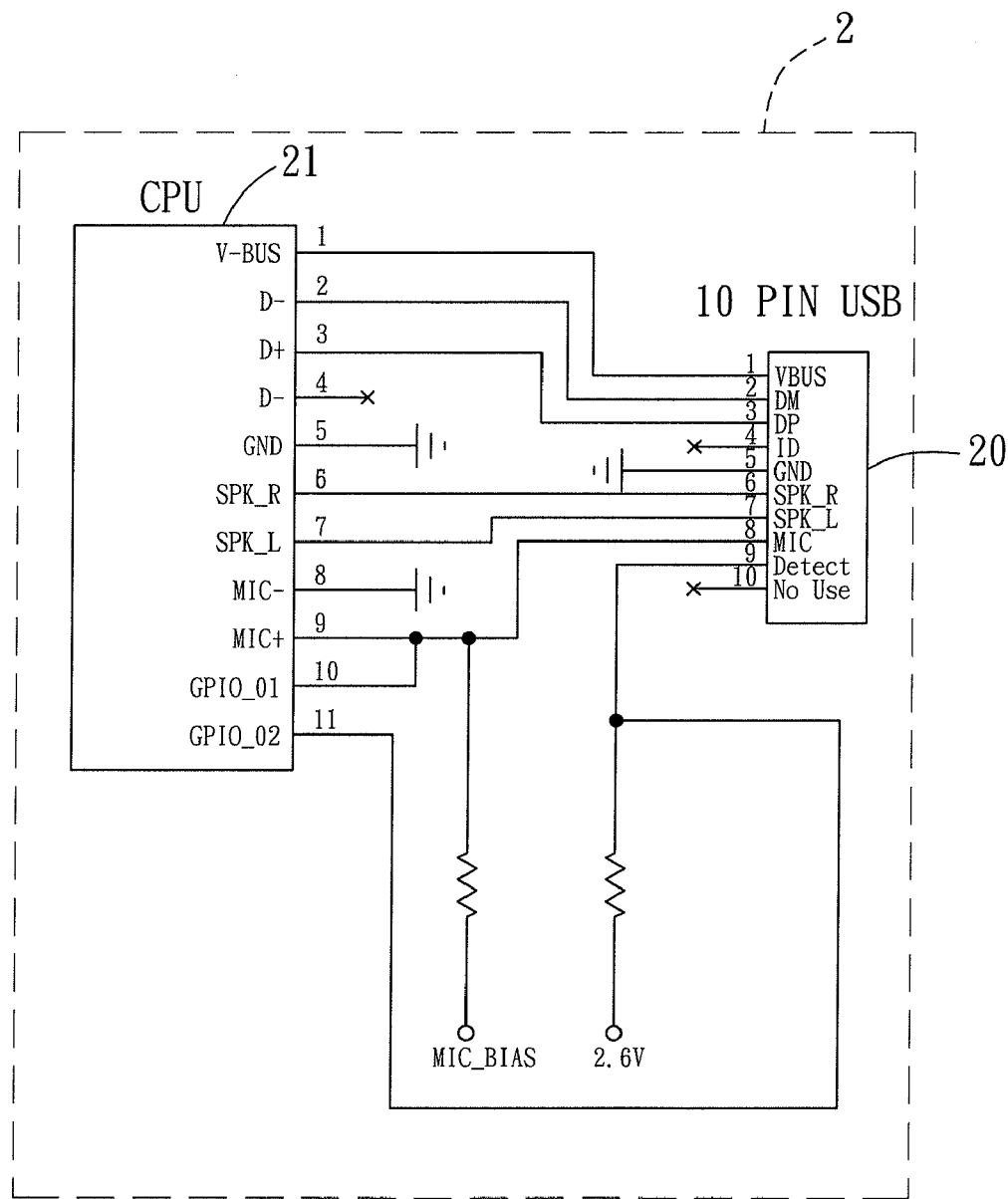
FIG. 1 is a schematic circuit diagram of a conventional mobile phone with a USB connector.
Figure 2:
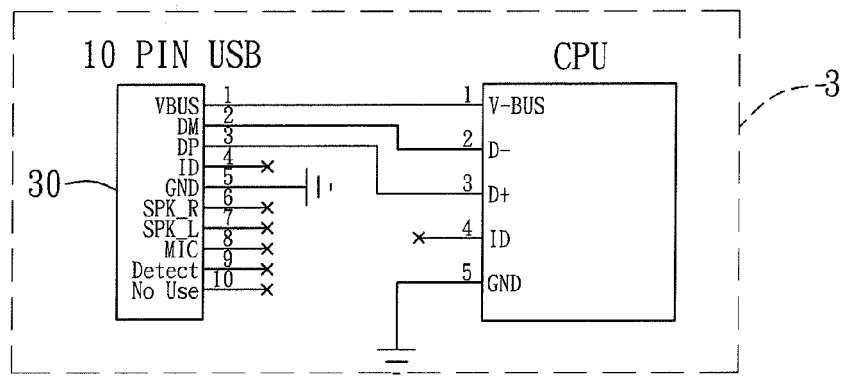
FIG. 2 is a schematic circuit diagram of a conventional computer device with a USB connector.
Figure 3:
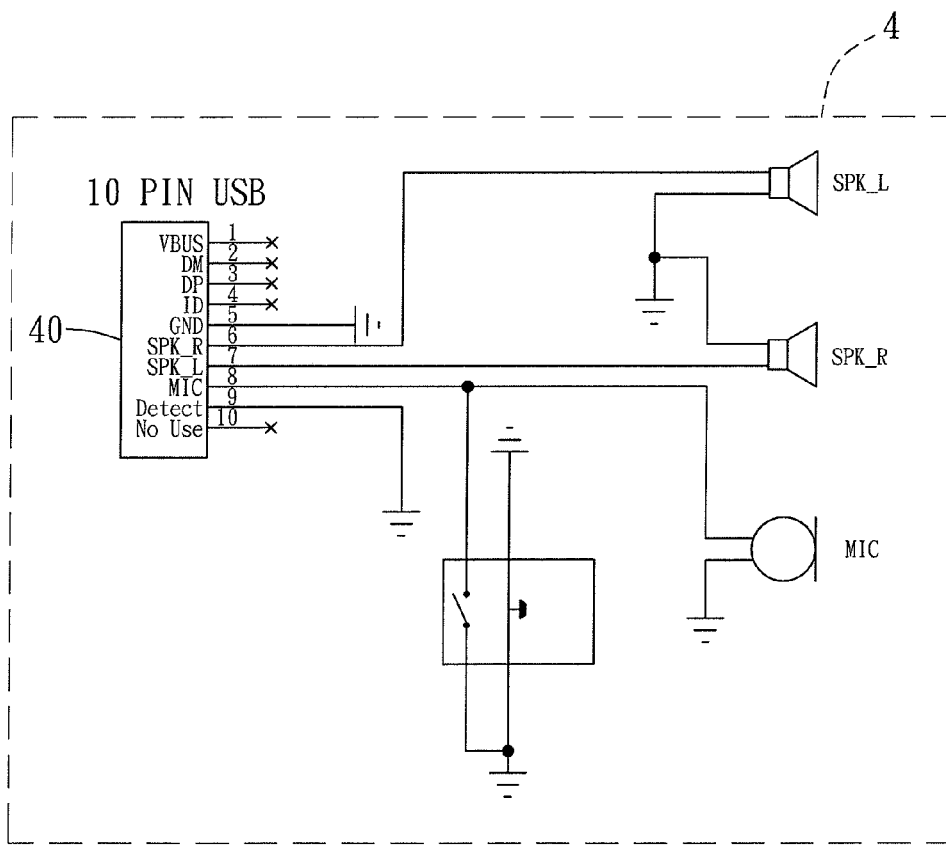
FIG. 3 is a schematic circuit diagram of a conventional external earphone/microphone device.
Figure 4:
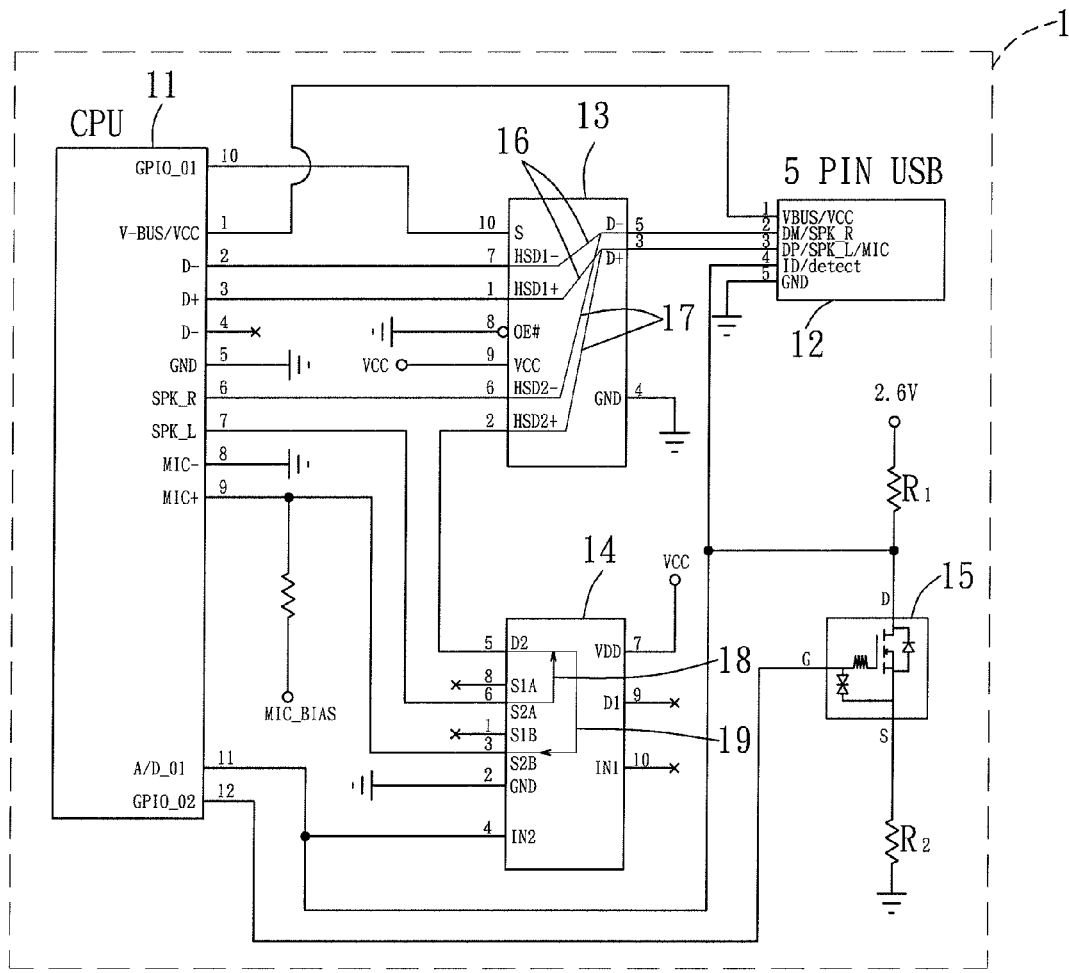
FIG. 4 is a schematic circuit diagram of the preferred embodiment of an electronic device with a 5-pin mini USB connector according to the present invention.

FIG. 4 shows the preferred embodiment of an electronic device 1 according to the present invention. The electronic device 1 in this embodiment is exemplified as a mobile phone, and includes a central processing unit 11, a USB connector 12, and a signal transmission path selection circuit which includes a USB switch 13, an audio path selector 14, and a transistor switch 15.

In this embodiment, the central processing unit 11 includes a pair of data pins (D+, D−) for receiving/transmitting data, a pair of audio signal output pins (SPK_R) and (SPK_L), a pair of audio signal reception pins (MIC−) and (MIC+), a first control pin (GPIO_01) for controlling the USB switch 13, a detect pin (A/D_01) for detecting the state of use of the USB connector 12, and a second control pin (GPIO_02) for controlling conduction of the transistor switch 15.

Figure 5:
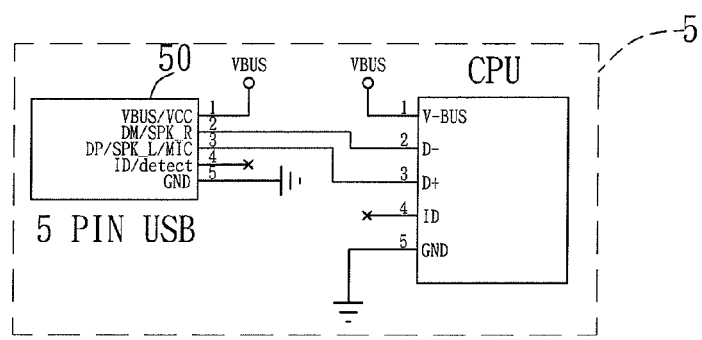
FIG. 5 is a schematic circuit diagram of a conventional computer device having a 5-pin mini USB connector for connection to the preferred embodiment.
Figure 6:
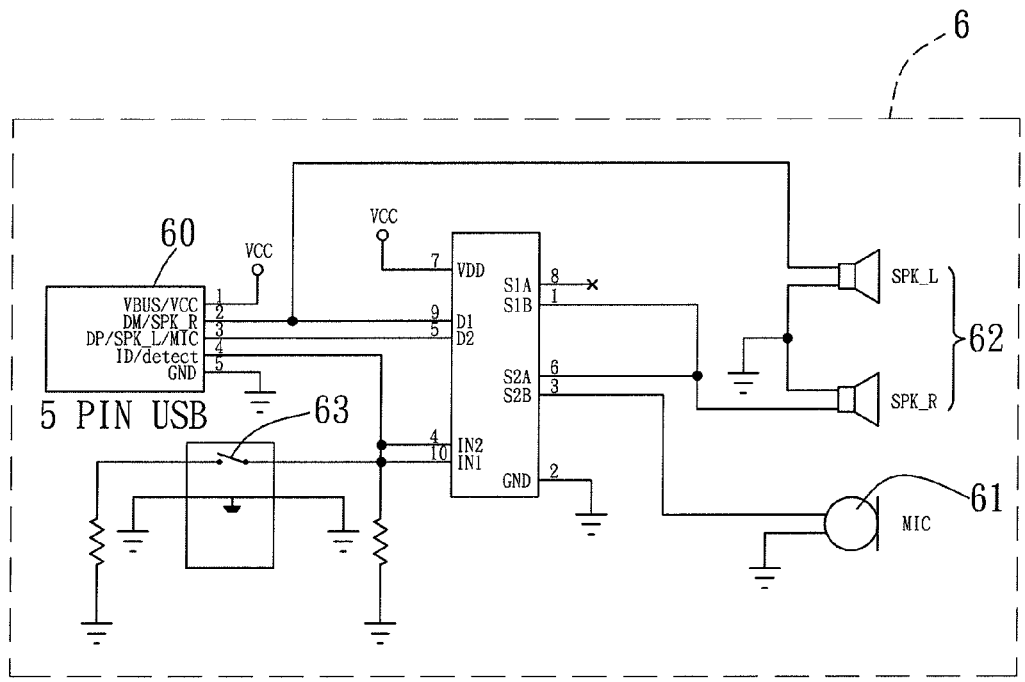
FIG. 6 is a schematic circuit diagram of a conventional external earphone/microphone device having a 5-pin mini USB connector for connection to the preferred embodiment.

The USB connector 12 in this embodiment is a mini USB connector with five pins, and is for connection to a matching mini USB connector 50 provided on a computer device 5 as shown in FIG. 5, or to a matching mini USB connector 60 provided on an external earphone/microphone device 6 as shown in FIG. 6, so as to permit transmission of data, such as text, images, audio-visual data, etc., between the electronic device 1 and the computer device 5 (USB mode) or transmission of audio signals, such as music, voice, etc., between the electronic device 1 and the external earphone/microphone device 6 (audio mode).

As shown in FIG. 4, the USB connector 12 (as well as the mini USB connectors 50 and 60) includes: a power pin (VBUS/VCC), a data/right speaker pin (DM/SPK_R), a data/left speaker/microphone pin (DP_SPK_L/MIC), a detect pin (ID/detect) and a ground pin (GND).

The USB switch 13 interconnects the central processing unit 11 and the USB connector 12, and includes a pair of data pins (HSD1−, HSD1+) connected respectively to the data pins (D+, D−) of the central processing unit 11, a pair of audio pins (HSD2−, HSD2+), the audio pin (HSD2−) being connected to the audio signal output pin (SPK_R) of the central processing unit 11, the audio pin (HSD2+) being connected to the audio signal output pin (SPK_L) of the central processing unit 11 through the audio path selector 14, and a pair of output/input pins (D−, D+) connected respectively to the data/right speaker pin (DM/SPK_R) and the data/left speaker/microphone pin (DP_SPK_L/MIC) of the USB connector 12. The datapins (HSD1−, HSD1+) are connected to the output/input pins (D−, D+) to thereby form a data transmission path 16. The audio pins (HSD2−, HSD2+) are connected respectively to the output/input pins (D−, D+) to thereby form an audio signal transmission path 17. Moreover, the USB switch 13 further includes a pin (S) connected electrically to the first control pin (GPIO_01) of the central processing unit 11 for receiving a control signal from the central processing unit 11.

Figure 7:
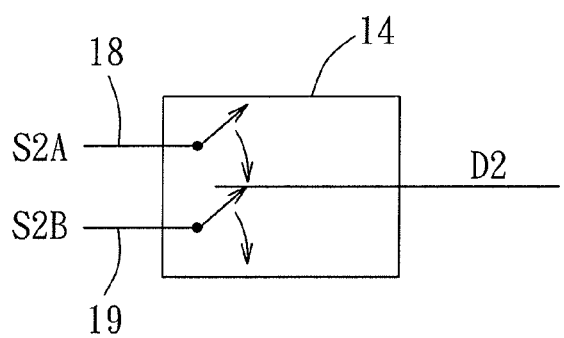
FIG. 7 is a schematic diagram illustrating how an audio path selector of the preferred embodiment switches between a first audio path and a second audio path.

The audio path selector 14 is connected electrically to the USB switch 13 and the central processing unit 11, and includes an audio input terminal (S2A) connected to the audio signal output pin (SPK_L) of the central processing unit 11, an audio output terminal (S2B), an audio output/input terminal (D2) connected to the audio pin (HSD2+) of the USB switch 13, and a control pin (IN2) connected to the detect pin (A/D_01) of the central processing unit 11. The audio input terminal (S2A) is connected to the audio output/input terminal (D2) to thereby form a first audio path 18. The audio output terminal (S2B) is connected to the audio output/input terminal (D2) to thereby form a second audio path 19. FIG. 7 is a schematic diagram illustrating switching between the first audio path 18 and the second audio path 19 in the audio path selector 14. The audio path selector 14 selects one of the first audio path 18 and the second audio path 19 in response to control by the central processing unit 11 (to be described in detail hereinafter).

The transistor switch 15 in this embodiment is an NMOS transistor, and has a gate (G) controlled by the second control pin (GPIO_02) of the central processing unit 11, a drain (D) connected to a 2.6V power source through a resistor (R1), and a source (S) grounded through a resistor (R2). Moreover, the detect pin (A/D_01) of the central processing unit 11 is connected to the drain (D) of the transistor switch 15.

Figure 8:
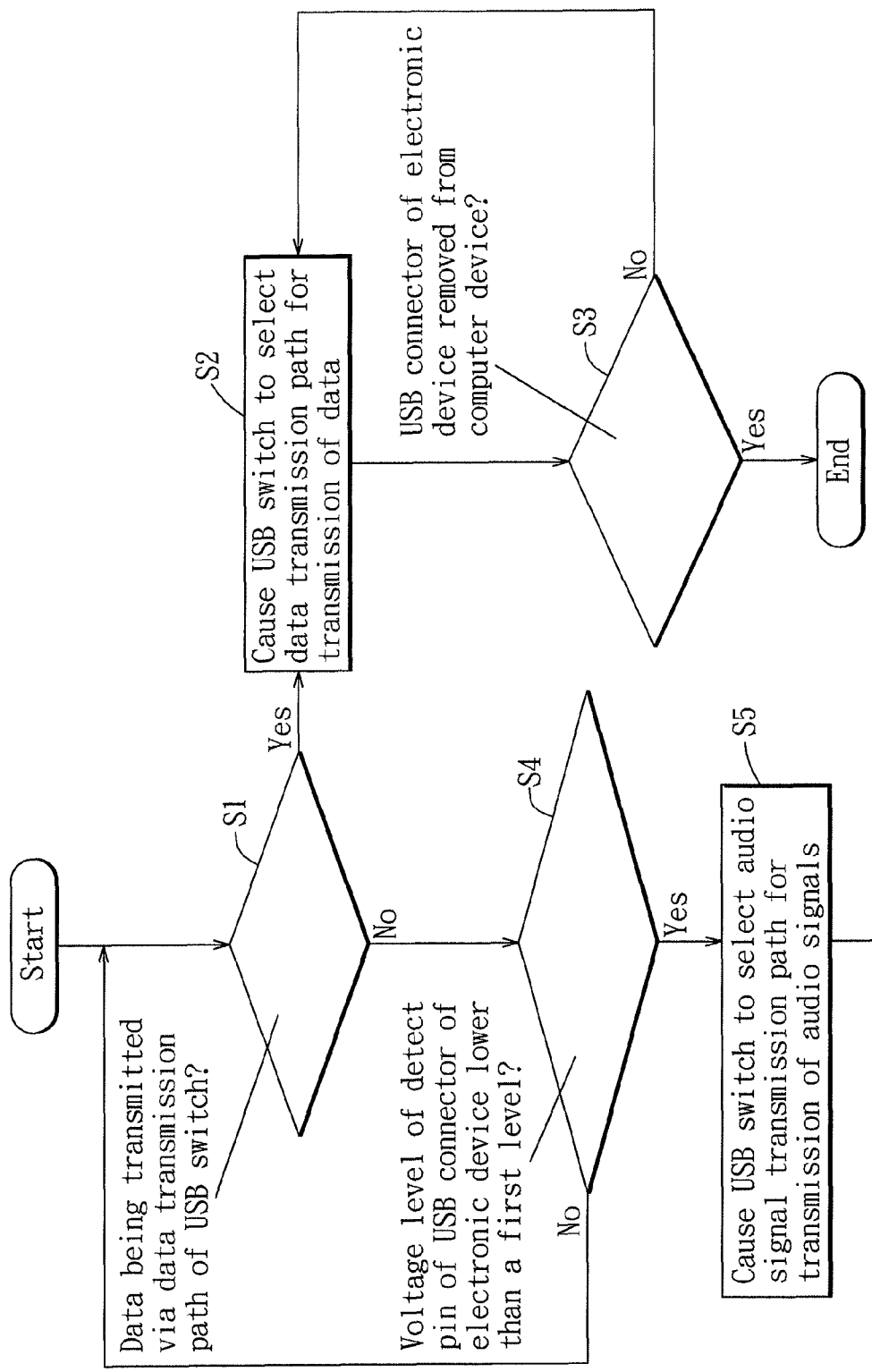
FIGS. 8 and 9 are flowcharts of the preferred embodiment of a signal transmission path selection method according to the present invention.

FIG. 8 illustrates a signal transmission path selection method according to an embodiment of the invention. In step S1, the central processing unit 11 detects whether data is being transmitted via the data transmission path 16 of the USB switch 13. Specifically, when the electronic device 1 is turned on, the central processing unit 11 will monitor the data pins (D+, D−) thereof to determine whether the USB connector 12 of the electronic device 1 is connected to the USB connector 50 of the computer device 5, i.e., whether the data pins (D+, D−) have an initial voltage level. If so, step S2 is executed, in which the central processing unit 11 sends a first selection signal to the pin (S) of the USB switch 13 via the first control pin (GPIO_01) to cause operation in the USB mode for data transmission. That is, the central processing unit 11 can be connected to the USB connector 12 through the data transmission path 16 of the USB switch 13 to permit access of data to and from the computer device 5. Moreover, since the transistor switch 15 is not electrically conducted via the second control pin (GPIO_02) of the central processing unit 11 at this time, the detect pin (ID/detect) of the USB connector 12 which is connected to the drain (D) of the transistor switch 15 is at a first level of approximately 2.3 V.

In the meantime, in step S3, the central processing unit 11 keeps on monitoring the data pins (D+, D−) thereof so as to determine whether the USB connector 12 of the electronic device 1 is removed from the computer device 5. If so, the data transmission operation is terminated. Otherwise, steps S2 and S3 are repeated until the USB connector 12 of the electronic device 1 is removed from the computer device 5.

On the other hand, if the central processing unit 11 determines that the electronic device 1 is not connected to the computer device 5 in step S1, step S4 is executed. In step S4, the central processing unit 11 detects via the detect pin (A/D_01) whether the voltage of the detect pin (ID/detect) of the USB connector 12 is lower than the first level (2.3 V). If so, this indicates that the USB connector 60 of the external earphone/microphone device 6 is connected to the USB connector 12 of the electronic device 1. Subsequently, in step S5, the central processing unit 11 sends a second selection signal to the pin (S) of the USB switch 13 via the first control pin (GPIO_01) to cause the USE switch 13 to operate in the audio mode for transmission of audio signals via the audio signal transmission path 17.

Moreover, when the USB connector 60 of the external earphone/microphone device 6 is connected to the USB connector 12 of the electronic device 1 and there is no incoming call on the electronic device 1, the central processing unit 11 causes the transistor switch 15 to remain non-conducting, and the voltage of the detect pin (ID/detect) of the USB connector 12 (same for the detect pin (A/D_01)) is lowered to a second level (approximately 2V) lower than the first level (2.3 V), and is maintained at the second level (2V). When there is an incoming call on the electronic device 1, the second control pin (GPIO_02) of the central processing unit 11 causes the transistor switch 15 to electrically conduct, so that the voltage of the detect pin (ID/detect) of the USB connector 12 is lowered to a third level (approximately 0.6 V) lower than the second level.

Figure 9:
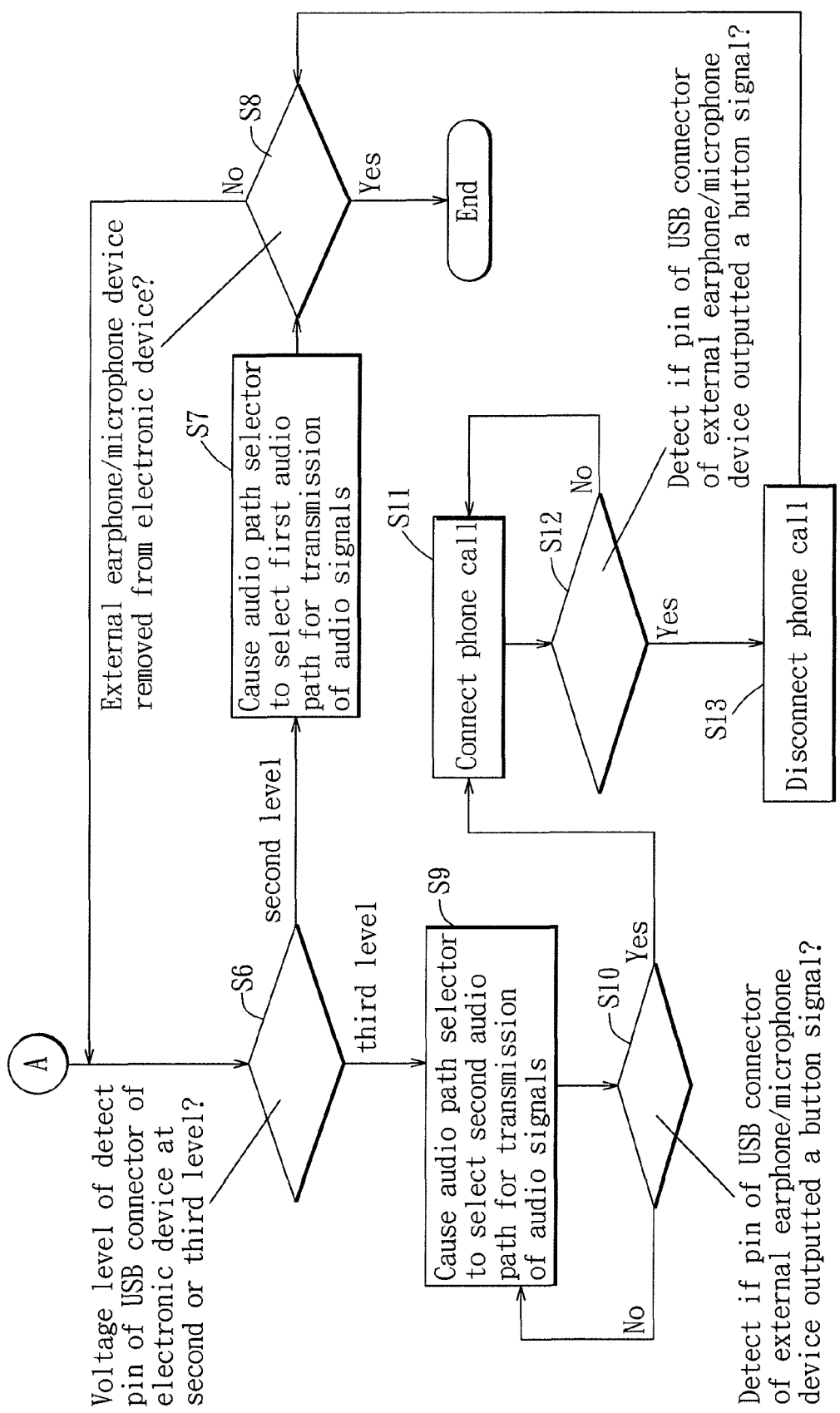

Therefore, as shown in FIG. 9, in step S6, the central processing unit 11 determines whether there is an incoming call on the electronic device 1 by inspecting whether the voltage of the detect pin (ID/detect) of the USB connector 12 (A/D_01 of the central processing unit 11) is at the second level (2 V) or the third level (0.6 V). If it is detected that the voltage of the detect pin (ID/detect) (A/D_01) is at the second level (2 V), step S7 is executed, in which the central processing unit 11 controls the audio path selector 14 (through the detect pin (A/D_01) and the pin (IN2) of the audio path selector 14) to send audio signals to the audio signal transmission path 17 of the USB switch 13 through the first audio path 18, so that the central processing unit 11 transmits music signals to the external earphone/microphone device 6. At this time, the central processing unit 11 is connected to the audio pin (HSD2−) of the USB switch 13 and to the audio pin (HSD2+) of the USB switch 13 through the audio input terminal (S2A) and the audio output/input terminal (D2) of the audio path selector 14 (i.e., the first audio path 18), so that music is transmitted to the external earphone/microphone device 6 through the audio signal transmission path 17 to allow a user to listen to the music. Therefore, when the voltage of the detect pin (ID/detect) of the USB connector 12 is maintained at the second level (2.0 V), the central processing unit 11 controls the audio path selector 14 to continue transmitting music signals through the first audio path 18, so that music signals outputted from the central processing unit 11 can continue to be transmitted to the external earphone/microphone device 6 through the terminals (S2A) and (D2), and the audio pins (HSD2+, HSD2−) of the USB switch 13. At the same time, in step S8, the central processing unit 11 continues to monitor the data pins (D+, D−) thereof to determine whether the external earphone/microphone device 6 is removed from the USB connector 12 of the electronic device 1. If so, transmission of the music signals to the USB connector 12 of the electronic device 1 through the audio signal transmission path 17 and the first audio path 18 is stopped. Otherwise, steps S6 to S8 are repeated until the external earphone/microphone device 6 is removed from the USB connector 12 of the electronic device 1.

Thus, step S6 is repeated to constantly monitor voltage level changes in the detect pin (ID/detect). When it is detected by the central processing unit 11 that the voltage of the detect pin (ID/detect) has dropped to the third level (0.6 V) in step S6, which indicates that there is an incoming call, in step S9, the central processing unit 11 controls the audio path selector 14 to switch to the second audio path 19, so that the audio signal reception pin (MIC+) of the central processing unit 11 is connected to the audio pin (HSD2+) of the USB switch 13 through the second audio path 19, and is further connected to a microphone 61 of the external earphone/microphone device 6 through the audio signal transmission path 17. Consequently, the audio signals from the central processing unit 11 are transmitted to an earphone 62 of the external earphone/microphone device 6 via the USB connector 12 only through another audio pin (HSD2−, mono) of the USB switch 13.

In other words, in step S6, the selection of which of the first audio path 18 and the second audio path 19 of the audio path selector 14 is to be used for audio signal transmission is mainly based on the voltage level of the detect pin (ID/detect). Therefore, the central processing unit 11 selects the first audio path 18 if there is no incoming call, and selects the second audio path 19 if there is an incoming call. That is, if there is an incoming call after the electronic device 1 is connected to the external earphone/microphone device 6, before executing step S9 to select the second audio path 19, the central processing unit 11 will first execute step S7 to select the first audio path 18 and then perform step S6 to determine whether there is an incoming call when the determination in step S8 is negative. If there is an incoming call before the electronic device 1 is connected to the external earphone/microphone device 6, the central processing unit 11 will perform steps S1→S4→S5→S6 and then directly execute step S9 to select the second audio path 19 after the external earphone/microphone device 6 is connected.

In addition, as shown in FIG. 6, the external earphone/microphone device 6 is generally equipped with a button 63 which is operable to answer or disconnect a phone call. When the button 63 is depressed, the external earphone/microphone device 6 will send a button signal (which is a pulse signal that drops from 0.6V to 0.35V and subsequently rises to 0.6V) to the detect pin (ID/detect) of the USB connector 12 of the electronic device 1 through the USB connector 60. Thus, in step S10, when the detect pin (A/D_01) of the central processing unit 11 receives the button signal from the detect pin (ID/detect), it is determined that the user desires to answer the call. Then, in step S11, the call is connected, and voice signals are transmitted via the second audio path 19 of the audio path selector 14 and the audio signal transmission path 17 of the USB switch 13 to the external earphone/microphone device 6, so that voice signals from the calling party are transmitted from the central processing unit 11 to the earphone 62 of the external earphone/microphone device 6 through the audio path selector 14 and the USB switch 13, and so that voice signals inputted via the microphone 63 of the external earphone/microphone device 6 are received and are further transmitted to the audio signal reception pin (MIC+) of the central processing unit 11 through the second audio path 19 of the audio path selector 14.

Furthermore, in step S12, when the user presses the button 63 again, which indicates that the user intends to terminate the call session, a button signal is outputted from the detect pin (ID/detect) of the USB connector 60 of the external earphone/microphone device 6. Then, in step S13, the central processing unit 11 receives the button signal and causes the transistor switch 15 to return to the non-conducting state, thereby disconnecting the phone call. The flow then goes back to step S8, in which the voltage levels of the data pins (D+, D−) are monitored to determine whether the external earphone/microphone device 6 is removed from the USB connector 12 of the electronic device 1. If so, transmission of the music signals to the USB connector 12 through the audio signal transmission path 17 and the first audio path 18 is stopped. Otherwise, the flow returns to step S7, in which the audio path selector 14 is caused to select the first audio path 18 for audio signal transmission, thereby resuming the transmission of music. Steps (S6)→(S7)→(S8) or (S6)→(S9)~(S13)→(S8) are then repeated until the external earphone/microphone device 6 is removed from the USB connector 12 of the electronic device 1.

In sum, in this embodiment, by detecting whether the USB connector 12 is connected to the computer device 5 or the external earphone/microphone device 6, the central processing unit 11 can control the USB switch 13 to correspondingly select the data transmission path 16 for transmission of data or the audio signal transmission path 17 for transmission of audio signals. Furthermore, the central processing unit 11 controls the audio path selector 14 to select the first audio path 18 for transmission of earphone signals when there is no incoming call, and controls the audio path selector 14 to select the second audio path 19 for transmission of microphone signals when there is an incoming call. Thus, the electronic device 1 can operate in both the USB mode and the audio mode using the USB connector 12 with only five pins, and space available in the electronic device 1 can be saved.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An electronic device comprising:
 a central processing unit;
 a USB connector;
 a USB switch interconnecting said central processing unit and said USB connector, and having a data transmission path and an audio signal transmission path for signal transmission between said central processing unit and said USB connector, said USB switch selecting said data transmission path for transmission of data according to a first selection signal from said central processing unit, and selecting said audio signal transmission path for transmission of audio signals according to a second selection signal from said central processing unit; and
 an audio path selector electrically connected to said central processing unit and said USB switch, and having a first audio path for output of audio signals from said central processing unit to said audio signal transmission path of said USB switch, and a second audio path for output of audio signals from said audio signal transmission path of said USB switch to said central processing unit.

2. The electronic device of claim 1, wherein said USB connector includes a data/right speaker pin and a data/left speaker/microphone pin, which are electrically connected to said USB switch for transmission of data and audio signals.

3. The electronic device of claim 1, wherein said USB switch includes: a pair of data pins connected to said central processing unit; a pair of audio pins, one of said audio pins being connected to said central processing unit via said audio path selector; and a pair of output/input pins connected to a pair of data/audio pins of said USB connector, said data pins being connected to said output/input pins so as to form the data transmission path, said audio pins being connected to said output/input pins so as to form the audio signal transmission path.

4. The electronic device of claim 3, wherein said central processing unit generates the first selection signal upon detecting that said data pins have received data.

5. The electronic device of claim 3, wherein said USB connector includes a detect pin, said detect pin having a voltage which is lower than a first level when said USB connector is connected to an external earphone/microphone device, said central processing unit generating the second selection signal upon detecting that the voltage of said detect pin is lower than the first level.

6. The electronic device of claim 5, wherein said audio path selector includes an audio input terminal and an audio output terminal which are connected to said central processing unit, and an audio output/input terminal connected to said one of said audio pins of said USB switch, said audio input terminal being connected to said audio output/input terminal to form the first audio path, said audio output terminal being connected to said audio output/input terminal to form the second audio path.

7. The electronic device of claim 6, further comprising a transistor switch electrically connected to said detect pin of said USB connector and said central processing unit, wherein said central processing unit controls said transistor switch to cause the voltage of said detect pin to be maintained at a second level and to thereby control said audio path selector to select the first audio path for transmission of audio signals, and said central processing unit further controls said transistor switch to cause the voltage of said detect pin to be maintained at a third level and to thereby control said audio path selector to select the second audio path for transmission of audio signals.

8. The electronic device of claim 7, wherein said electronic device is a mobile phone, and is configured such that the voltage of said detect pin is maintained at the second level when said USB connector is connected to an external earphone/microphone device, and such that the voltage of said detect pin is maintained at the third level when there is an incoming call on said electronic device.

9. The electronic device of claim 2, wherein said USB connector is a 5-pin mini USB connector.

10. The electronic device of claim 7, wherein said transistor switch is an NMOS transistor.

11. A signal transmission path selection circuit, comprising:
   a USB switch having a data transmission path and an audio signal transmission path, said USB switch selecting the data transmission path for data transmission according to a first selection signal, and selecting the audio signal transmission path for transmission of audio signals according to a second selection signal; and
   an audio path selector electrically connected to said USB switch, and having a first audio path for output of received audio signals to said audio signal transmission path of said USB switch, and a second audio path for output of audio signals from said audio signal transmission path of said USB switch.

12. The signal transmission path selection circuit of claim 11, wherein said USB switch includes: a pair of data pins; a pair of audio pins, one of said audio pins being adapted to be connected to a central processing unit via said audio path selector; and a pair of output/input pins; said data pins being connected to said output/input pins so as to form the data transmission path, said audio pins being connected to said output/input pins so as to form the audio signal transmission path.

13. The signal transmission path selection circuit of claim 12, wherein the first selection signal is generated upon receipt of data by said data pins.

14. The signal transmission path selection circuit of claim 13, wherein said audio path selector includes an audio input terminal, an audio output terminal, and an audio output/input terminal connected to said one of said audio pins of said USB switch, said audio input terminal being connected to said audio output/input terminal so as to form the first audio path, said audio output terminal being connected to said audio output/input terminal so as to form the second audio path.

15. The signal transmission path selection circuit of claim 14, further comprising a transistor switch electrically connected to said audio path selector, said transistor switch being controllable to cause said audio path selector to select one of the first and second audio paths for transmission of audio signals.

16. A signal transmission path selection method for use between a central processing unit and a USB connector of an electronic device, said signal transmission path selection method comprising:
   (A) providing a data transmission path and an audio signal transmission path for signal transmission between the central processing unit and the USB connector;
   (B) selecting the data transmission path for transmission of data according to a first selection signal from the central processing unit, and selecting the audio signal transmission path for transmission of audio signals according to a second selection signal from the central processing unit; and
   (C) providing a first audio path and a second audio path between the audio signal transmission path and the central processing unit, the first audio path being for output of audio signals from the central processing unit to the audio signal transmission path, the second audio path being for output of audio signals from the audio signal transmission path to the central processing unit.

17. The signal transmission path selection method of claim 16, wherein the USB connector includes a data/right speaker pin and a data/left speaker/microphone pin, which are electrically connected to the USB switch for transmission of data and audio signals.

18. The signal transmission path selection method of claim 17, wherein the central processing unit includes a pair of data pins connected respectively to the data/right speaker pin and the data/left speaker/microphone pin of the USB connector via the data transmission path, the central processing unit detecting voltage level changes in the data pins when the USB connector is connected to a computer device, and generating the first selection signal in response thereto.

19. The signal transmission path selection method of claim 16, wherein the USB connector includes a detect pin, the detect pin having a voltage which is lower than a first level when the USB connector is connected to an external earphone/microphone device, the central processing unit generating the second selection signal upon detecting that the voltage of the detect pin is lower than the first level.

20. A signal transmission path selection method, comprising:
   (A) providing a data transmission path and an audio signal transmission path for signal transmission, selecting the data transmission path for transmission of data according to a first selection signal, and selecting the audio signal transmission path for transmission of audio signals according to a second selection signal; and
   (B) providing a first audio path and a second audio path, the first audio path being for output of received audio signals to the audio signal transmission path, the second audio path being for output of the audio signals from the audio signal transmission path.

* * * * *